(12) United States Patent
Jin et al.

(10) Patent No.: US 11,187,728 B2
(45) Date of Patent: Nov. 30, 2021

(54) CURRENT SENSING DEVICE, METHOD AND SYSTEM

(71) Applicant: DELTA ELECTRONICS, INC., Taoyuan (TW)

(72) Inventors: Da Jin, Taoyuan (TW); Yahong Xiong, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 111 days.

(21) Appl. No.: 16/551,751

(22) Filed: Aug. 27, 2019

(65) Prior Publication Data

US 2020/0088769 A1    Mar. 19, 2020

(30) Foreign Application Priority Data

Sep. 14, 2018 (CN) .......................... 201811073384.4

(51) Int. Cl.
*G01R 15/18* (2006.01)
*H02M 1/00* (2006.01)

(52) U.S. Cl.
CPC ............. *G01R 15/183* (2013.01); *H02M 1/00* (2013.01); *H02M 1/0009* (2021.05)

(58) Field of Classification Search
CPC ............. G01R 15/183; G01R 19/0092; G01R 19/16552; G01R 19/10; G01R 19/00; G01R 15/202; H02M 1/00; H02M 2001/0009; H02M 2001/0064; H02M 3/33576; H02M 2001/0058; Y02B 70/10

(Continued)

(56) References Cited

U.S. PATENT DOCUMENTS

| 4,928,059 A | 5/1990 | Franklin et al. |
| 2013/0049744 A1* | 2/2013 | Mu ..................... G01R 33/1207 324/222 |

(Continued)

FOREIGN PATENT DOCUMENTS

| CN | 1570655 A | 1/2005 |
| CN | 101106335 A | 1/2008 |

(Continued)

OTHER PUBLICATIONS

Hao, Ruixiang et al., "A Combined LLC Resonant Converter with Voltage and Current Auto-Balance Capability," Transactions of China Electrotechnical Society, vol. 31, No. 20, Oct. 2016.

(Continued)

*Primary Examiner* — Christopher P McAndrew
(74) *Attorney, Agent, or Firm* — CKC & Partners Co., LLC

(57) ABSTRACT

The present disclosure provides a current sensing device, method and system, where the device is applied in a power conversion circuit. The current sensing device includes a first winding coupled to the resonant inductor, a second winding and an integrating circuit coupled to a primary winding of the transformer having a first input terminal, a second input terminal, an output terminal, and a common terminal; one terminal of the first winding is coupled to the first input terminal of the integrating circuit, the other terminal of the first winding and the other terminal of the second winding are coupled and connected to the common terminal of the integrating circuit; one terminal of the second winding is coupled to the second input terminal of the integrating circuit.

24 Claims, 7 Drawing Sheets

(58) Field of Classification Search
USPC .......................................................... 324/127
See application file for complete search history.

(56) References Cited

U.S. PATENT DOCUMENTS

| | | | |
|---|---|---|---|
| 2013/0221975 | A1 | 8/2013 | Ward |
| 2014/0268899 | A1* | 9/2014 | Hosotani ........... H02M 3/33569 363/17 |
| 2015/0124489 | A1 | 5/2015 | Dai et al. |
| 2019/0058408 | A1* | 2/2019 | Hao .................... H02M 5/4585 |
| 2020/0150154 | A1* | 5/2020 | Chang .................. G01R 35/005 |

FOREIGN PATENT DOCUMENTS

| | | |
|---|---|---|
| CN | 100521492 C | 7/2009 |
| CN | 101584253 A | 11/2009 |
| CN | 101951713 A | 1/2011 |
| CN | 101622777 B | 8/2012 |
| CN | 203466730 U | 3/2014 |
| CN | 104101768 A | 10/2014 |
| JP | S6475970 A | 3/1989 |

OTHER PUBLICATIONS

Corresponding China Office Action dated Jul. 8, 2021.

\* cited by examiner

CURRENT SENSING DEVICE, METHOD AND SYSTEM

CROSS-REFERENCE TO RELATED APPLICATION

This application claims priority to Chinese Patent Application No. 201811073384.4, filed on Sep. 14, 2018, which is hereby incorporated by reference in its entirety.

TECHNICAL FIELD

The present disclosure relates to the field of power electronics and, in particular, to a current sensing device, a method and a system.

BACKGROUND

In power electronics, it is often necessary to sense a current signal for controlling and protecting the electronic circuit. Therefore, an accurate current signal sensing technology is needed to understand a change of the current signal in the electronic circuit and to reflect a true circuit current. Current signals in a typical electronic circuit include a switching current, an input current, and a load current.

Currently, the most common current sensing method is connecting in series a sense resistor in a load loop and obtaining the load current by sensing a current flowing through the sense resistor.

When the power module has a large output current, the use of the sense resistor connected in series will cause a large loss in terms of resistance, and the sense resistor will also increase in volume as its power increases. If the resistance value of the sense resistor is reduced in order to reduce the loss, sampling accuracy of the current will also be reduced, thereby affecting the sensing result of the load current.

SUMMARY

The present disclosure provides a current sensing device, method and system for sensing a current in a power conversion circuit in a lossless manner, a circuit structure in the device is simple, power consumption is low, and a sensing result is accurate.

In a first aspect, an embodiment of the present disclosure provides a current sensing device having a transformer and a resonant inductor, includes a first winding coupled to the resonant inductor, a second winding coupled to a primary winding of the transformer, and an integrating circuit having a first input terminal, a second input terminal, an output terminal, and a common terminal, wherein one terminal of the first winding is coupled to the first input terminal of the integrating circuit, the other terminal of the first winding and the other terminal of the second winding are coupled and connected to the common terminal of the integrating circuit; one terminal of the second winding is coupled to the second input terminal of the integrating circuit, and the output terminal and the common terminal of the integrating circuit constitute two output terminals of the current sensing device respectively, wherein a voltage across two output terminals of the current sensing device is used to calculate a current difference between a current of the resonant inductor and a magnetizing current of the transformer.

In a second aspect, an embodiment of the present disclosure provides a current sensing method applied in a power conversion circuit having a transformer and a resonant inductor, includes: obtaining a voltage across two output terminals of the current sensing device representing a current difference between a current flowing through the resonant inductor and a magnetizing current of the transformer.

In a third aspect, an embodiment of the present disclosure provides a power system, including: a power conversion circuit and the current sensing device according to any one of the first aspect, the current sensing device is configured to obtain a voltage across two output terminals of the current sensing device representing a current difference between a current flowing through the resonant inductor and a magnetizing current of the transformer.

BRIEF DESCRIPTION OF DRAWINGS

In order to more clearly illustrate technical solutions in the embodiments of the present disclosure or in the prior art, drawings used in the description of the embodiments or the prior art will be briefly described below. Obviously, the drawings in the following description are some embodiments of the present disclosure, and those skilled in the art can obtain other drawings based on these drawings without any creative effort.

DETAILED DESCRIPTION OF EMBODIMENTS

In order to make objectives, technical solutions, and advantages of embodiments of the present disclosure clearer, the technical solutions in the embodiments of the present disclosure will be clearly and completely described in the following with reference to the accompanying drawings in the embodiments of the present disclosure. Obviously, the described embodiments are a part of the embodiments of the present disclosure, rather than all of the embodiments. Based on the embodiments of the present disclosure, all other embodiments obtained by those skilled in the art without any creative effort are within the scope of the present disclosure.

The terms such as "first", "second", "third", "fourth", etc. (if present) in the specification, claims, and the above drawings of the present disclosure are used to distinguish similar objects, instead of describing a particular sequence or order. It is to be understood that the data used in this way is interchangeable where appropriate, so that the embodiments of the present disclosure described herein can be implemented in a sequence other than those illustrated or described herein. Furthermore, the terms such as "comprising" and "having" and any variation thereof are intended to cover a non-exclusive inclusion, for example, processes, methods, systems, products, or devices that include a series of steps or units are not necessarily limited to those steps or units that are clearly listed, but may include other steps or units that are not explicitly listed or are inherent to those processes, methods, products or devices.

The technical solutions of the present disclosure will be described in detail below with specific embodiments. The following specific embodiments may be combined with each other, and the same or similar concepts or processes may not be described again in some embodiments.

Figure 1:
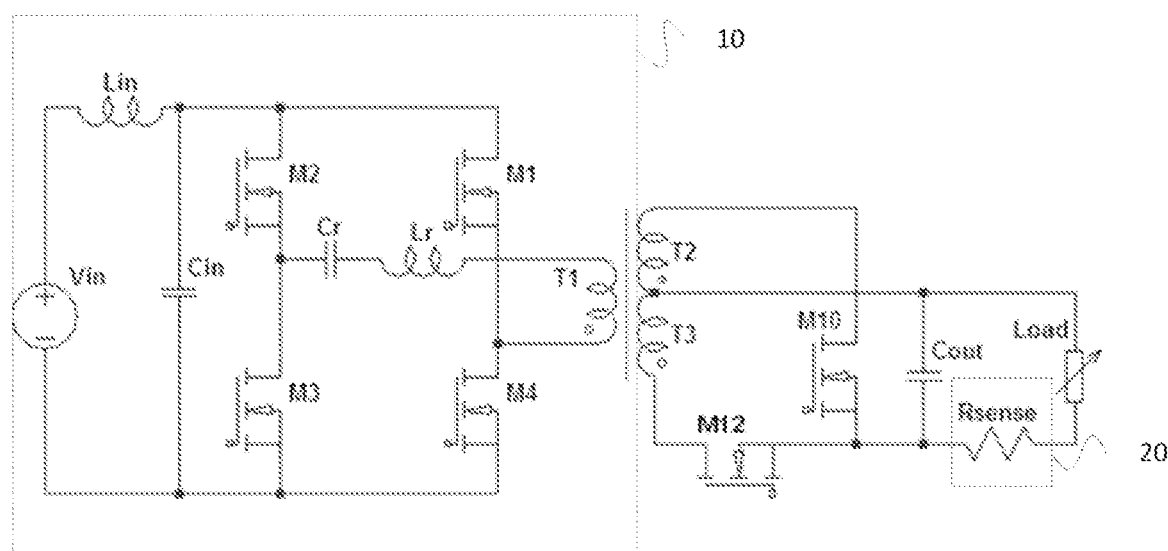
FIG. 1 is a schematic diagram of a current sensing circuit for a power module in the prior art.

FIG. 1 is a schematic diagram of a current sensing circuit for a power module in the prior art, as shown in FIG. 1, including: a power conversion circuit 10 and a current sensing circuit 20. The power conversion circuit 10 is a LLC conversion circuit. The input voltage Vin is first filtered by the input inductor Lin and the input capacitor Cin to generate a constant DC voltage; Then, an AC voltage is formed on the primary winding T1 side of the transformer through ON and OFF control of the first switch M1 to the fourth switch M4. A secondary winding T2 of the transformer and a secondary winding T3 of the transformer are both coupled to the primary winding T1 of the transformer. Through ON or OFF control of the twelfth switch M12 and the tenth switch M10, a voltage across the secondary winding T2 and the secondary winding T3 alternately charge the output capacitor Cout. With reference to FIG. 1, in order to sense a load current, sense resistors Rsense are connected in series in a load loop to serve as the current sensing circuit 20, and the load current is obtained by sensing a current flowing through the sense resistors Rsense. However, in this method, when the output current is large, even if the sense resistors Rsense are small, a large loss occurs in the resistors Rsense. Taking a case where a small resistance value of 1 mohm is applied as an example, when the current flowing through the load is 100 A, the power loss of the resistor is as high as 10 W. To meet a requirement of 10 W, the volume of the sense resistor Rsense will also be relatively large, and as the current increases, it will increase with the increase of its power. If the resistance value of Rsense is reduced in order to reduce the loss, sampling accuracy of the load current will also be reduced.

According to a current sensing device and method thereof provided in the present disclosure, especially for a high-frequency alternating current, a waveform of the load current can be restored through two coupled windings and an integrating circuit, and aims to solve the above technical problems of the prior art, greatly reducing the loss of the sensing circuit.

The technical solutions of the present disclosure and how the technical solutions of the present application solve the above technical problems will be described in detail below with reference to specific embodiments. The following specific embodiments may be combined with each other, and the same or similar concepts or processes may not be described again in some embodiments. Embodiments of the present disclosure will be described below with reference to the accompanying drawings.

Figure 2:
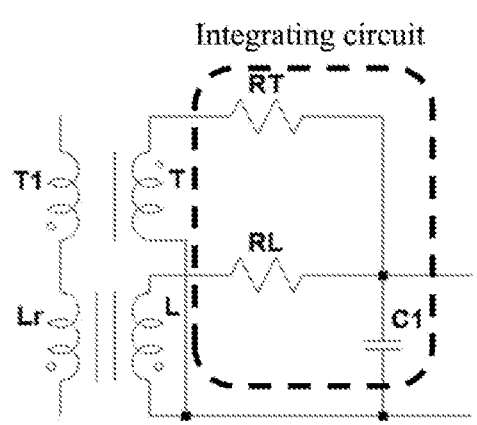
FIG. 2 is a schematic diagram of a circuit structure of a current sensing device according to a first embodiment of the present disclosure.

FIG. 2 is a schematic diagram of a circuit structure of a current sensing device according to a first embodiment of the present disclosure, which can be applied in the power conversion circuit 10 as shown in FIG. 1. The load current in the circuit is proportional to a current difference between a current of the resonant inductor Lr and a magnetizing current of the transformer T1. As shown in FIG. 2, the power sensing device in the present embodiment may include: a first winding L, a second winding T and an integrating circuit. The integrating circuit may include a first resistor RL, a second resistor RT and a first capacitor C1; where one terminal of the first resistor RL forms a first input terminal of the integrating circuit, one terminal of the second resistor RT forms a second input terminal of the integrating circuit, the other terminal of the first resistor RL is coupled to the other terminal of the second resistor RT and a first terminal of the first capacitor to constitute an output terminal of the integrating circuit, the other terminal of the first capacitor is a common terminal of the integrating circuit. The first winding L is coupled to the resonant inductor Lr of the power conversion circuit 10, and the second winding T is coupled to a primary winding T1 of the transformer of the power conversion circuit 10; one terminal of the first winding L is coupled to the first input terminal of the integrating circuit, the other terminal of the first winding L is connected to the common terminal of the integrating circuit; one terminal of the second winding T is coupled to the second input terminal of the integrating circuit, and the other terminal of the second winding T is coupled to the common terminal of the integrating circuit. A voltage across the first capacitor C1 is proportional to a current difference between a current of the resonant inductor Lr and a magnetizing current of the transformer T1. The current sensing device can obtain the load current of the power conversion circuit 10 via a voltage value of voltage between the output and the common terminal of the integrating circuit.

In the present embodiment, in conjunction with the power conversion circuit 10 as shown in FIG. 1, the power conversion circuit 10 further includes a resonant capacitor Cr, where the transformer, the resonant inductor Lr and the resonant capacitor Cr are connected in series. The first winding L and the resonant inductor Lr are magnetically coupled to each other through a magnetic core; and the second winding T and the transformer are magnetically coupled to each other through a magnetic core.

The first resistor RL can represent a resistance between one terminal of the winding L and an output of the voltage, for example, the first resistor RL may include a separate resistor, a resistor network connected in series or in parallel or in series and parallel, but is not limited thereto. The second resistor RT can represent a resistance between one terminal of the winding T and an output terminal of the voltage, for example, the second resistor RT may include a separate resistor, a resistor network connected in series or in parallel or in series and parallel, but is not limited thereto.

In one implementation, the first winding L is positively coupled to the resonant inductor Lr, and the second winding T is reversely coupled to the primary winding T1 of the transformer.

In another implementation, the first winding L is reversely coupled to the resonant inductor Lr, and the second winding T is positively coupled to the primary winding T1 of the transformer.

Specifically, resistance values of the first resistor RL and the second resistor RT have the following relationship:

$$RT/RL = (NL*LT1)/(Lr*NT) \tag{1}$$

where RL is a resistance value of the first resistor, RT is a resistance value of the second resistor, NL is a turns ratio of the first winding to the resonant inductor, NT is a turns ratio of the second winding to the primary winding of the transformer, LT1 is magnetizing inductance of the transformer, and Lr is inductance of the resonant inductor.

In one embodiment, the number of turns of the first winding L and the second winding T may be one respectively. In other embodiment, the first resistor RL and the second resistor RT may have equal resistance values. In an actual circuit, the above parameters are not limited.

In the present embodiment, the difference between the magnetizing current of the transformer T1 and the current of the resonant inductor Lr can be obtained according to a voltage value of voltage across the first capacitor C1. Specifically, the representation between the current Ilr flowing through the resonant inductor and the voltage of the resonant inductor VLr in any switching period is:

$$Ilr(t) = \frac{1}{Lr} \int VLr(t)dt \tag{2}$$

where Lr is the inductance of the resonant inductor, Ilr(t) is the current of the resonant inductor, and VLr(t) is the voltage of the resonant inductor.

The representation between the primary side voltage VT1 of the transformer and the magnetizing current IT1 is:

$$IT1(t) = \frac{1}{LT1} \int VT1(t)dt \tag{3}$$

where LT1 is magnetizing inductance of the transformer, and IT1 is the current of the primary winding of the transformer, that is, the magnetizing current.

Therefore, according to the representations (2) and (3), the representation of the current difference in one switching period is:

$$Ilr(t) - IT1(t) = \frac{1}{Lr} \int VLr(t)dt - \frac{1}{LT1} \int VT1(t)dt \tag{4}$$

as shown in FIG. 2, the second winding T is reversely coupled to the primary winding T1 of the transformer, and is connected in series with the second resistor RT and then connected in parallel with C1, a voltage across the second winding T is VT, a voltage across the primary winding T1 of the transformer is VT1, a turns ratio of the primary winding T1 of the transformer to the second winding T is NT, and the two voltages are proportional:

$$VT1(t)/VT(t) = NT \tag{5}$$

the first winding L is positively coupled to the resonant inductor Lr, and is connected in series with the first resistor RL and then connected in parallel with C1, a voltage across the first winding L is VL(t), a voltage across the resonant inductor Lr is VLr(t), a turns ratio of the first winding L to the resonant inductor Lr is NL, and voltage values of VL(t) and VLr(t) are proportional to the number of turns of the winding L and the winding Lr:

$$VLr(t)/VL(t) = NL \tag{6}$$

Figure 3:
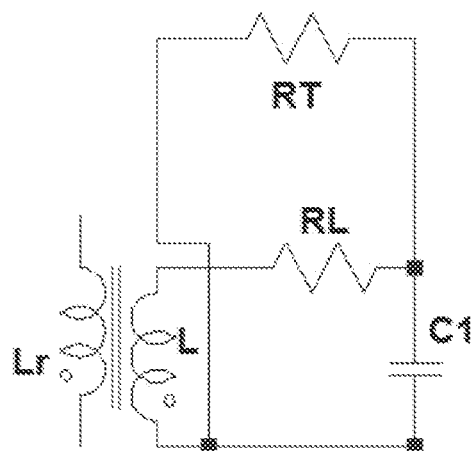
FIG. 3 is a schematic diagram of a circuit structure when output voltage at both terminals of a first winding L is separately applied to a first capacitor C1.
Figure 4:
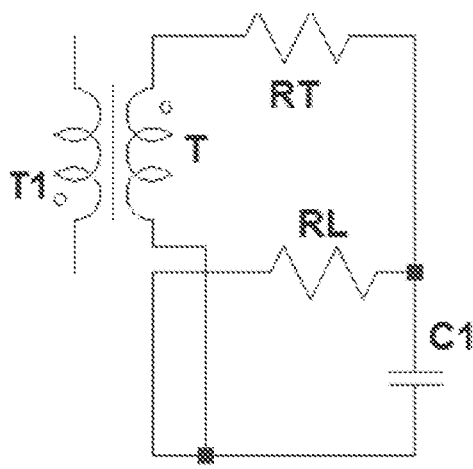
FIG. 4 is a schematic diagram of a circuit structure when output voltage at both terminals of a second winding T is separately applied to a first capacitor C1.

FIG. 3 is a schematic diagram of a circuit structure when output voltage at both terminals of a first winding L is separately applied to a first capacitor C1, and FIG. 4 is a schematic diagram of a circuit structure when output voltage at both terminals of the second winding T is separately applied to a first capacitor C1.

In conjunction with FIG. 3 and FIG. 4, the voltage at both terminals of the first capacitor C1 is obtained, and the voltage $V_{C1}$ at both terminals of C1 is calculated as follows:

$$Vc1(t) = \frac{1}{C}\left(\int \frac{VL(t)}{RL}dt - \int \frac{VT(t)}{RT}dt\right) \tag{7}$$

In combination with equations (5) and (6), equation (7) can be written as follows:

$$Vc1(t) = \frac{1}{C}\left(\int \frac{1}{RL \cdot NL} \cdot VLr(t)dt - \int \frac{1}{RT \cdot NT} \cdot VT1(t)dt\right) \tag{8}$$

Provided that equation (1) is satisfied, equations (4) and (8) are each in a proportional relationship, that is, a voltage proportional to the current difference can be obtained across the first capacitor C1.

In the present embodiment, it is only necessary to additionally wind the first winding L on the magnetic core of the original resonant inductor Lr and additionally wind the second winding T on the magnetic core of the original transformer, both of which are respectively connected in series with the first resistor RL and the second resistor RT. Because the first resistor RL and the second resistor RT are not in the power loop, and there is no power loss with respect to the first resistor RL and the second resistor RT. Therefore, the power sensing device has no additional loss with respect to the power conversion circuit, and the accuracy of current sensing is high. In some embodiment, the first winding L and the second winding T of the current sensing device in the present embodiment can be disposed in the same region as the winding of the transformer, so that no additional PCB area is occupied. In other embodiment, since an instantaneous voltage value of a voltage across the first capacitor C1 is proportional to a load current, the voltage across the capacitor can also be used for fast short circuit protection.

The representation of the relationship between the load current and the current difference is: Io=n*[Ilr(t)−IT1(t)], where n is a turns ratio of the primary coil and the secondary coil of the transformer of the conversion circuit 10. An average value for the load current can be obtained by sensing the voltage at both terminals of the capacitor C1.

Figure 5:
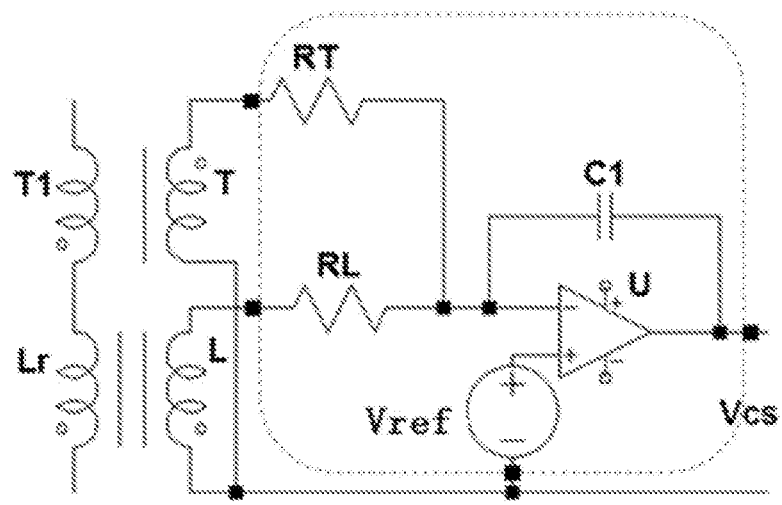
FIG. 5 is a schematic diagram of a circuit structure of a current sensing device according to a second embodiment of the present disclosure.

FIG. 5 is a schematic diagram of a circuit structure of a current sensing device according to a second embodiment of the present disclosure, which can be applied in the power conversion circuit 10 as shown in FIG. 1. Differing from the circuit in FIG. 2, the integrating circuit in FIG. 5 further includes an operational amplifier. The power sensing device in the present embodiment may include: a first winding L, a second winding T and a first integrating circuit. The first integrating circuit may include a first resistor RL, a second resistor RT, a first capacitor C1, a first operational amplifier and a first voltage source Vref, where one terminal of the first resistor RL is a first input terminal of the integrating circuit, one terminal of second resistor RT is a second input terminal of the integrating circuit, the other terminal of the first resistor RL and the other terminal of the second resistor RT are coupled to the first terminal of the first capacitor and connected to a negative input terminal of the first operational amplifier, the other terminal of the first capacitor is coupled to the output of the first operational amplifier to constitute the output terminal of the integrating circuit. A positive input terminal of the first operational amplifier is connected to a positive terminal of the first voltage source Vref, a negative terminal of the first voltage source Vref is the common terminal of the integrating circuit. The first winding L is coupled to the resonant inductor Lr of the power conversion circuit 10, and the second winding T is coupled to the primary winding T1 of the transformer of the power conversion circuit 10; one terminal of the first winding L is coupled to the first input terminal of the integrating circuit, and the other terminal of the first winding L is connected to the common terminal of the integrating circuit; one terminal of the second winding T is coupled to the second input terminal of the integrating circuit, and the other terminal of the second winding T is coupled to the common terminal of the integrating circuit.

When the first voltage source Vref has a voltage value of 0, the voltage across the first capacitor C1 is proportional to the current difference between the current across the resonant inductor Lr and the magnetizing current of the transformer T1, the current sensing device can obtain the load current of the power conversion circuit 10 through the voltage value of voltage between the output terminal and the common terminal of the integrating circuit.

In the present embodiment, in conjunction with the power conversion circuit 10 as shown in FIG. 1, the power conversion circuit 10 further includes the resonant capacitor Cr, where the transformer, the resonant inductor Lr and the resonant capacitor Cr are connected in series. The first winding L and the resonant inductor Lr are magnetically coupled to each other through a magnetic core; and the second winding T and the transformer are magnetically coupled to each other through a magnetic core.

The first resistor RL can represent a resistance between one terminal of the winding L and the output terminal of the integrating circuit, for example, the first resistor RL may include a separate resistor, a resistor network connected in series or in parallel or in series and parallel, but is not limited thereto. The second resistor RT can represent a resistance between one terminal of the winding T and the output terminal of the integrating circuit, for example, the second resistor RT may include a separate resistor, a resistor network connected in series or in parallel or in series and parallel, but is not limited thereto.

In one implementation, the first winding L is reversely coupled to the resonant inductor Lr, and the second winding T is positively coupled to the primary winding T1 of the transformer.

In another implementation, the first winding L is positively coupled to the resonant inductor Lr, and the second winding T is reversely coupled to the primary winding T1 of the transformer.

When the first voltage source Vref has a voltage value of 0, the voltage value of voltage across the output port of the current sensing device is a voltage VC1(t) across the first capacitor, likewise, the voltage proportional to the current difference can also be obtained across the first capacitor C1, as shown in the following equation (9), $$Vc1(t) = \frac{1}{C}\left(\int \frac{1}{RL \cdot NL} \cdot VLr(t)dt - \int \frac{1}{RT \cdot NT} \cdot VT1(t)dt\right) \quad (9)$$

In the present embodiment, according to the high amplification factor of the operational amplifier, the common mode rejection ratio of the power sensing device is increased, the load driving capability is increased, and the sensing accuracy is high.

Figure 6:
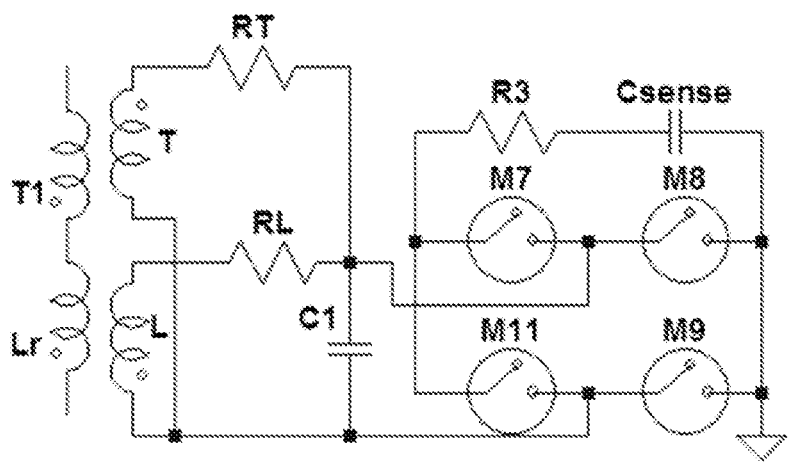
FIG. 6 is a schematic diagram of a circuit structure of a current sensing device according to a third embodiment of the present disclosure.

FIG. 6 is a schematic diagram of a circuit structure of a current sensing device according to a third embodiment of the present disclosure, as shown in FIG. 6, based on the circuit of FIG. 2, the current sensing device of the present embodiment further may include: a full-wave rectifying circuit, where both terminals of the first capacitor C1 are respectively connected to the full-wave rectifying circuit. The full-wave rectifying circuit includes: a first switch M7, a second switch M8, a third switch M9, a fourth switch M11, a third resistor R3 and a first sense capacitor Csense. A first terminal of the first switch M7 is coupled to one terminal of third resistor R3 and a first terminal of the fourth switch M11 respectively, a second terminal of the first switch M7 is coupled to one terminal of the first capacitor C1 and a first terminal of the second switch M8 respectively; the other terminal of the third resistor R3 is connected to a second terminal of the second switch M8 and a first terminal of the third switch M9 through the first sense capacitor Csense; a second terminal of the third switch M9 is coupled to a second terminal of the fourth switch M11 and the other terminal of the first capacitor C1 respectively.

In the present embodiment, the first switch M7 and the third switch M9 are consistent in switch states, both of which are consistent with the switches M2 and M4 of the power conversion circuit 10 in switch states; the second switch M8 and the fourth switch M11 are consistent in switch states, both of which are consistent with the switches M1 and M3 of the power conversion circuit 10 in switch states; a phase difference between control signals of the first switch M7 and the second switch M8 is 180 degrees, and a phase difference between control signals of the third switch M9 and the fourth switch M11 is 180 degrees. The first switch M7, the second switch M8, the third switch M9 and the fourth switch M11 in the present embodiment may be: a switching device such as a field effect transistor, a power switch tube, a relay, or the like, and a specific type of the switching device is not limited in the present embodiment.

Figure 7:
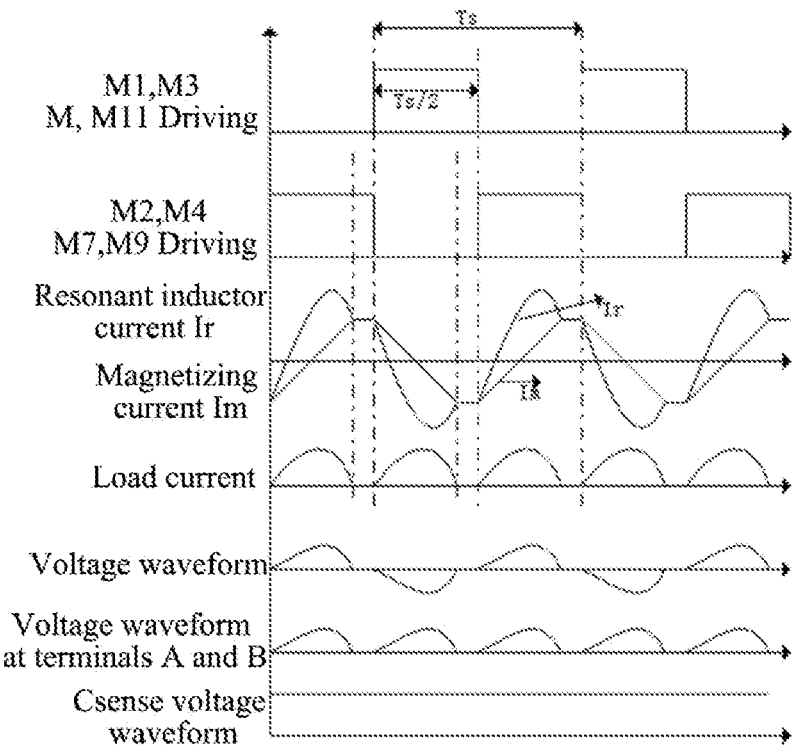
FIG. 7 is a waveform diagram corresponding to the circuit in FIG. 6.

FIG. 7 is a waveform diagram corresponding to the circuit in FIG. 6. As shown in FIG. 7, in the present embodiment, an effective voltage value of the voltage across the first sense capacitor Csense is equal to an effective value of the AC voltage component of the voltage across the first capacitor C1. The voltage value of the voltage across the first sense capacitor Csense is proportional to an average value for a current difference between a current flowing through the resonant inductor and a magnetizing current of the transformer.

Specifically, in combination with FIG. 6 and FIG. 7, the full-wave rectifying circuit can be applied in the case of poor current symmetry, where: the first switch M7 is in phase with the third switch M9, the second switch M8 is in phase with the fourth switch M11; a phase difference between control signals of the first switch M7 and the second switch M8 is 180 degrees, a phase difference between control signals of the third switch M9 and the fourth switch M11 is 180 degrees, the voltage across the first capacitor C1 passes through the full-wave rectifying circuit and the filter circuit including the third resistor R3 and the first sense capacitor Csense, and finally a current sensing signal is obtained via the voltage across the first sense capacitor Csense.

In the present embodiment, the voltage across the first capacitor C1 is obtained through the full-wave rectifying circuit, so that the average value for the load current can be obtained.

Figure 8:
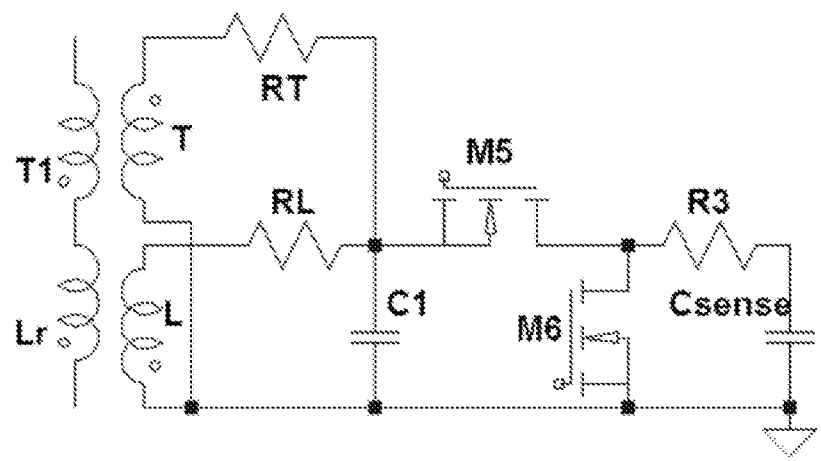
FIG. 8 is a schematic diagram of a circuit structure of a current sensing device according to a fourth embodiment of the present disclosure.

FIG. 8 is a schematic diagram of a circuit structure of a current sensing device according to a fourth embodiment of the present disclosure, as shown in FIG. 8, based on the circuit of FIG. 2, the current sensing device in the present embodiment further may include: a half-wave rectifying circuit, where both terminals of the first capacitor C1 are respectively connected to the half-wave rectifying circuit. The half-wave rectifying circuit includes: a fifth switch M5, a sixth switch M6, a third resistor R3 and a first sense capacitor Csense; a first terminal of the fifth switch M5 is coupled to one terminal of the first capacitor C1, a second terminal of the fifth switch M5 is respectively coupled to one terminal of the third resistor R3 and a first terminal of the sixth switch M6; the other terminal of the third resistor R3 is coupled to one terminal of the first sense capacitor Csense, and the other terminal of the first sense capacitor Csense and a second terminal of the sixth switch M6 are both connected to the other terminal of the first capacitor C1.

In the present embodiment, a phase difference between the sixth switch M6 and the fifth switch M5 is 180 degrees. The fifth switch M5 and the sixth switch M6 in the present embodiment may be: a switching device such as a field effect transistor, a power switch tube, a relay, or the like, and a specific type of the switching device is not limited in the present embodiment.

Figure 9:
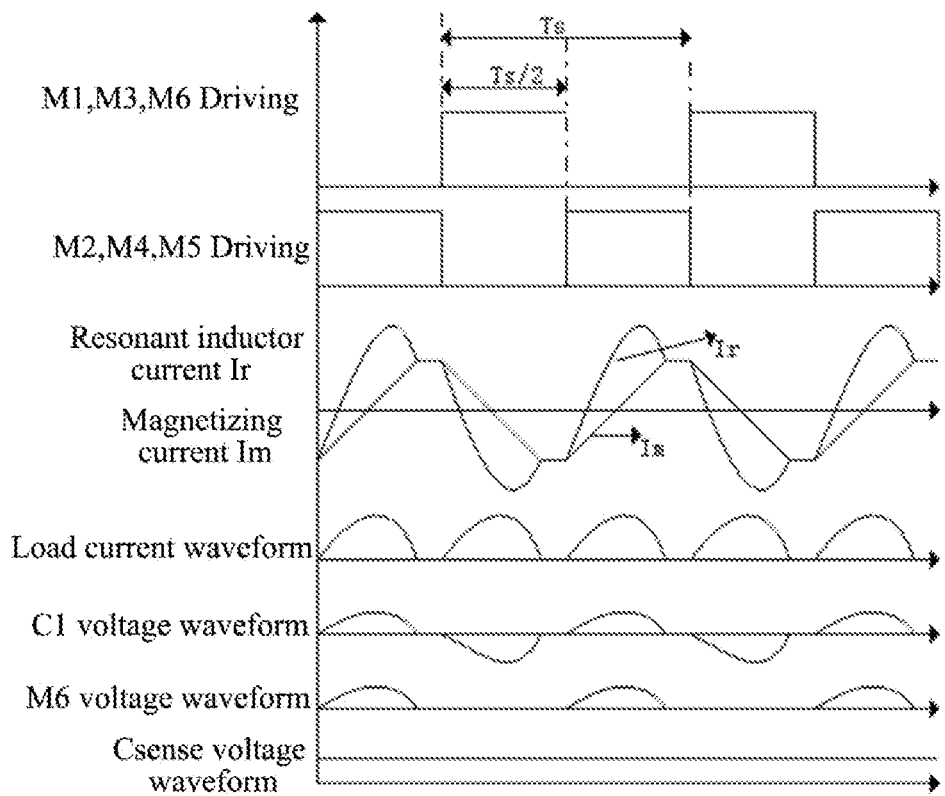
FIG. 9 is a waveform diagram corresponding to the circuit in FIG. 8.

FIG. 9 is a waveform diagram corresponding to the circuit in FIG. 8. As shown in FIG. 9, in the present embodiment, the voltage value of voltage across the first sense capacitor Csense is equal to a half of an effective value of the AC voltage component of voltage across the first capacitor C1. The voltage value of voltage across the first sense capacitor Csense is proportional to an average value for a current difference between a current flowing through the resonant inductor and a magnetizing current of the transformer.

Specifically, in combination with FIG. 1, FIG. 8 and FIG. 9, the drive signal of the sixth switch M6 is the same as the drive signals of the switches M1 and M3 of the power conversion circuit 10, the drive signal of the fifth switch M5 is the same as the drive signals of the switches M2 and M4 of the power conversion circuit 10, and a phase difference between the sixth switch M6 and the fifth switch M5 is 180 degrees. When the fifth switch M5 is turned on, the sixth switch M6 is turned off, and the first capacitor C1 charges the first sense capacitor Csense via the third resistor R3; when the sixth switch M6 is turned on, the fifth switch M5 is turned off, and the first capacitor C1 cannot transfer energy to load, so voltage value of the voltage across the first sense capacitor Csense is an average value for the voltage of the first capacitor C1 in half of the switching period. In one switching period, the voltage across the first capacitor C1 is symmetrical, and the voltage across the first sense capacitor Csense can accurately reflect an average value for the load current.

In the present embodiment, the voltage across the first capacitor C1 is obtained through a half-wave rectifying circuit, thereby obtaining an average value for the load current.

Figure 10:
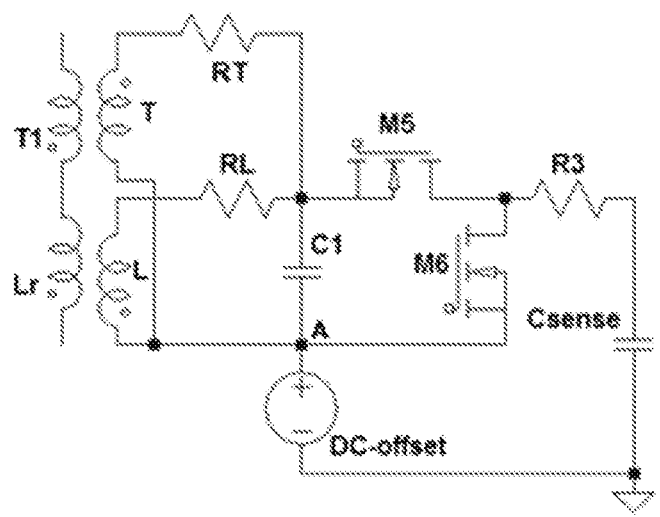
FIG. 10 is a schematic diagram of a circuit structure of a current sensing device according to a fifth embodiment of the present disclosure.

FIG. 10 is a schematic diagram of a circuit structure of a current sensing device according to a fifth embodiment of the present disclosure. As shown in FIG. 10, a second voltage source is added as a DC voltage bias DC_offset on the basis of FIG. 8, a relationship with regard to connection between other circuit elements is unchanged, and details will not be described herein again. The DC voltage bias DC_offset is a DC voltage, and the voltage value thereof needs to be greater than a lower voltage value which is a voltage value that is proportionally converted to the first capacitor C1 by the maximum negative current that the load is subjected to. When the sensing current is negative, the voltage from point A to ground will be less than the bias voltage, so the current sensing device in the present disclosure can still sense a negative current, thus it is possible to effectively protect the power module and calculate the negative current value. With continued reference to FIG. 5, the voltage value of the first voltage source in FIG. 5 may be greater than 0, and the above functions may also be implemented.

Figure 11:
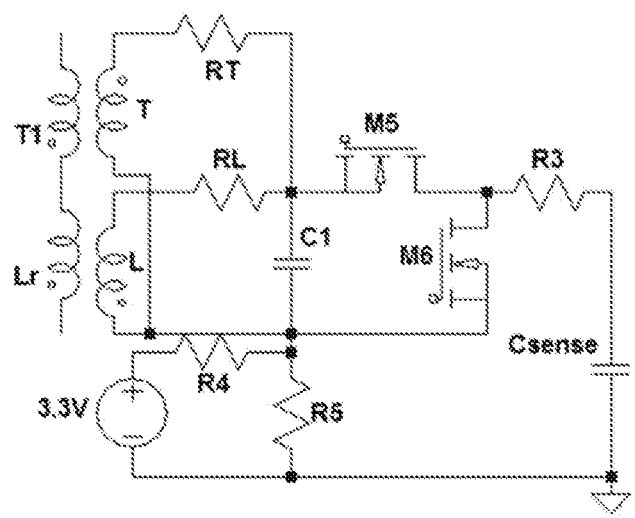
FIG. 11 is a schematic diagram of a circuit structure of a current sensing device according to a sixth embodiment of the present disclosure.

FIG. 11 is a schematic diagram of a circuit structure of a current sensing device according to a sixth embodiment of the present disclosure. As shown in FIG. 11, a bias voltage is used in FIG. 11 instead of the second voltage source to constitute a DC voltage bias DC_offset, taking a DC voltage of 3.3V as an example, after resistors R4 and R5 are connected in series for voltage division, the divided voltage across R5 is incorporate into the sensing circuit as a DC voltage bias.

An embodiment of the present disclosure further provides a current sensing method applied in a power conversion circuit, where the power conversion circuit includes: a transformer and a resonant inductor; the current sensing method includes: obtaining a current difference between a current flowing through the resonant inductor and a magnetizing current of the transformer using the current sensing device as shown in FIG. 2~FIG. 11.

Optionally, the power conversion circuit further includes a resonant capacitor; the transformer, the resonant inductor and the resonant capacitor are connected in series, where the current sensing method includes: obtaining a load current according to the current sensing circuit.

Optionally, the current sensing method includes: obtaining an average value for the load current according to the current sensing circuit.

An embodiment of the present disclosure further provides a power system, including: a power conversion circuit and the current sensing device as shown in the FIG. 2~FIG. 11 described above, the power conversion circuit includes: a transformer and a resonant inductor.

The current sensing device is configured to obtain a current difference between a current flowing through the resonant inductor and a magnetizing current of the transformer.

Finally, it should be noted that the above embodiments are only used to illustrate the technical solutions of the present disclosure, rather than limiting the present disclosure. Although the present disclosure has been described in detail with reference to the foregoing embodiments, it will be understood by those of ordinary skill in the art that the technical solutions described in the foregoing embodiments may be amended or equivalently substituted for some or all of the technical features. The amendments and substitutions do not make the essence of the corresponding technical solutions depart from the scope of the technical solutions in the embodiments of the present disclosure.

What is claimed is:

1. A current sensing device, applied in a power conversion circuit having a transformer and a resonant inductor, comprises:
    a first winding coupled to the resonant inductor;
    a second winding coupled to a primary winding of the transformer; and an integrating circuit having a first input terminal, a second input terminal, an output terminal, and a common terminal, wherein one terminal of the first winding is coupled to the first input terminal of the integrating circuit, the other terminal of the first winding and the other terminal of the second winding are coupled and connected to the common terminal of the integrating circuit; one terminal of the second winding is coupled to the second input terminal of the integrating circuit, and the output terminal and the common terminal of the integrating circuit constitute two output terminals of the current sensing device respectively, wherein a voltage across two output terminals of the current sensing device is used to calculate a current difference between a current of the resonant inductor and a magnetizing current of the transformer.

2. The current sensing device according to claim 1, wherein the integrating circuit comprises: a first resistor, a second resistor, and a first capacitor, one terminal of the first resistor forms the first input terminal of the integrating circuit, one terminal of the second resistor forms the second input terminal of the integrating circuit; the other terminal of the first resistor and the other terminal of the second resistor are both coupled to one terminal of the first capacitor and forms the output of the integrating circuit, the other terminal of the first capacitor forms the common terminal of the integrating circuit.

3. The current sensing device according to claim 1, wherein the integrating circuit comprises: a first resistor, a second resistor, a first capacitor and an operational amplifier, one terminal of the first resistor forms the first input terminal of the integrating circuit, one terminal of the second resistor forms the second input terminal of the integrating circuit; the other terminal of the first resistor and the other terminal of the second resistor are both coupled to one terminal of the first capacitor and a negative input terminal of the operational amplifier; the other terminal of the first capacitor is coupled to an output terminal of the operational amplifier, and forms the output of the integrating circuit; and a positive input terminal of the operational amplifier is electrically connected to the common terminal of the integrating circuit via a voltage source.

4. The current sensing device according to claim 1, wherein the resonant inductor is connected in series with the primary winding of the transformer.

5. The current sensing device according to claim 1, wherein the power conversion circuit further comprises a resonant capacitor, where the transformer, the resonant inductor and the resonant capacitor are connected in series.

6. The current sensing device according to claim 1, wherein the first winding and the resonant inductor are magnetically coupled to each other through a magnetic core; and the second winding and the transformer are magnetically coupled to each other through a magnetic core.

7. The current sensing device according to claim 6, wherein the first winding being coupled to the resonant inductor, and the second winding being coupled to the primary winding of the transformer comprise:
when the first winding is positively coupled to the resonant inductor, the second winding is reversely coupled to the primary winding of the transformer; or
when the first winding is reversely coupled to the resonant inductor, the second winding is positively coupled to the primary winding of the transformer.

8. The current sensing device according to claim 2, wherein the voltage value of voltage across two output terminals of the integrating circuit represents a load current.

9. The current sensing device according to claim 2, wherein resistance values of the first resistor and the second resistor have the following relationship:

$$RT/RL=(NL*LT1)/(Lr*NT)$$

wherein RL is a resistance value of the first resistor, RT is a resistance value of the second resistor, NL is a turns ratio of the first winding to the resonant inductor, NT is a turns ratio of the second winding to the primary winding of the transformer, LT1 is magnetizing inductance of the transformer, and Lr is inductance of the resonant inductor.

10. The current sensing device according to claim 1, wherein the number of turns of the first winding and the second winding is one.

11. The current sensing device according to claim 2, wherein the first resistor and the second resistor have equal resistance values.

12. The current sensing device according to claim 2, wherein an instantaneous voltage value of voltage across the first capacitor is proportional to the current difference.

13. The current sensing device according to claim 2, further comprising: a full-wave rectifying circuit, the output terminal and the common terminal of the integrating circuit are electrically connected to the full-wave rectifying circuit, respectively.

14. The current sensing device according to claim 13, wherein the full-wave rectifying circuit comprises: a first switch, a second switch, a third switch, a fourth switch, a third resistor, and a first sense capacitor;
a first terminal of the first switch is coupled to one terminal of the third resistor and a first terminal of the fourth switch respectively, a second terminal of the first switch is coupled to the output terminal of the integrating circuit and a first terminal of the second switch; the other terminal of the third resistor is respectively connected to a second terminal of the second switch and a first terminal of the third switch via the first sense capacitor; a second terminal of the third switch is coupled to a second terminal of the fourth switch and the common terminal of the integrating circuit;
wherein the first switch and the third switch are consistent in switch states, the second switch and the fourth switch are consistent in switch states, a phase difference between control signals of the first switch and the second switch is 180 degrees, a phase difference between control signals of the third switch and the fourth switch is 180 degrees.

15. The current sensing device according to claim 14, wherein the power conversion circuit further comprises: a seventh switch, an eighth switch, a ninth switch, a tenth switch, and a resonant capacitor;
a first terminal of the seventh switch is respectively coupled to one terminal of an input power and a first terminal of the eighth switch, a second terminal of the seventh switch is coupled to a first terminal of the tenth switch; a second terminal of the eighth switch is coupled to a first terminal of the ninth switch, a second terminal of the ninth switch is coupled to a second terminal of the tenth switch; the resonant capacitor, the resonant inductor and the primary winding of the transformer are connected in series between the second terminal of the seventh switch and the second terminal of the eighth switch;
wherein the eighth switch, the tenth switch, the first switch and the third switch are consistent in switch states; the seventh switch, the ninth switch, the second switch and the fourth switch are consistent in switch states.

16. The current sensing device according to claim 15, wherein a voltage value of voltage across the first sense capacitor is proportional to an average value for the current difference.

17. The current sensing device according to claim 2, further comprising: a half-wave rectifying circuit, the output terminal and the common terminal of the integrating circuit are electrically connected to the half-wave rectifying circuit, respectively.

18. The current sensing device according to claim 17, wherein
the half-wave rectifying circuit comprises: a fifth switch, a sixth switch, a fourth resistor, and a second sense capacitor;
a first terminal of the fifth switch is coupled to the output of the integrating circuit, a second terminal of the fifth switch is respectively coupled to one terminal of the fourth resistor and a first terminal of the sixth switch; the other terminal of the fourth resistor is coupled to one terminal of the second sense capacitor, the other terminal of the second sense capacitor and a second terminal of the sixth switch are both connected to the common terminal of the integrating circuit,
wherein a phase difference between control signals of the sixth switch and the fifth switch is 180 degrees.

19. The current sensing device according to claim 17, wherein
the half-wave rectifying circuit comprises: a fifth switch, a sixth switch, a fourth resistor and a second sense capacitor;
a first terminal of the fifth switch is coupled to the output of the integrating circuit, a second terminal of the fifth switch is respectively coupled to one terminal of the fourth resistor and a first terminal of the sixth switch; the other terminal of the fourth resistor is coupled to one terminal of the second sense capacitor, a second terminal of the sixth switch is coupled to the common terminal of the integrating circuit, and the common terminal of the integrating circuit is connected to the other terminal of the second sense capacitor via a direct current (DC) voltage bias;
wherein a phase difference between control signals of the sixth switch and the fifth switch is 180 degrees.

20. The current sensing device according to claim 18, wherein a voltage value of voltage across the second sense capacitor is proportional to an average value for the current difference.

21. A current sensing method, applied in a power conversion circuit having a transformer and a resonant inductor, comprises:
obtaining a voltage across two output terminals of the current sensing device according to claim 1, wherein the voltage represents a current difference between a current flowing through the resonant inductor and a magnetizing current of the transformer.

22. The current sensing method according to claim 21, wherein the power conversion circuit further comprises a resonant capacitor; the transformer, the resonant inductor and the resonant capacitor are connected in series, wherein
the current sensing method comprises: obtaining a voltage across two output terminals of the current sensing device representing a load current.

23. The current sensing method according to claim 21, wherein the current sensing device further comprises a full-wave rectifying circuit or a half-wave rectifying circuit,
the current sensing method comprises: obtaining an average value for a load current according to the current sensing device.

24. A power system, comprising: a power conversion circuit and the current sensing device according to claim 1, wherein the current sensing device is configured to obtain a voltage across two output terminals of the current sensing device representing a current difference between a current flowing through the resonant inductor and a magnetizing current of the transformer.

* * * * *